(12) United States Patent
Yao et al.

(10) Patent No.: US 8,502,151 B2
(45) Date of Patent: Aug. 6, 2013

(54) OPTICAL PROXIMITY SENSOR PACKAGE WITH LEAD FRAME

(75) Inventors: Yufeng Yao, Singapore (SG); Junhua He, Singapore (SG); Wee Sin Tan, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 595 days.

(21) Appl. No.: 12/697,276

(22) Filed: Jan. 31, 2010

(65) Prior Publication Data

US 2011/0186736 A1    Aug. 4, 2011

(51) Int. Cl.
   *G01J 5/20*      (2006.01)
   *G01J 5/02*      (2006.01)
   *H01L 27/146*   (2006.01)
   *H01L 31/0232*   (2006.01)
   *H01L 31/0203*   (2006.01)
   *H01L 21/00*    (2006.01)

(52) U.S. Cl.
    USPC ............... 250/338.4; 250/341.8; 257/435; 257/436; 257/433; 438/25; 438/26

(58) Field of Classification Search
    USPC .............. 250/338.1, 338.4, 341.8; 257/435, 257/436, 433; 438/25, 26
    See application file for complete search history.

(56) References Cited

U.S. PATENT DOCUMENTS

| | | | | |
|---|---|---|---|---|
| 5,367,166 A | * | 11/1994 | Matthews et al. | ........... 250/338.1 |
| 5,773,831 A | * | 6/1998 | Brouns | ................... 250/370.08 |
| 7,145,348 B2 | | 12/2006 | Nakazaki et al. | |
| 7,509,113 B2 | | 3/2009 | Knoedgen | |
| 2008/0205495 A1 | | 8/2008 | Trott | |
| 2009/0159900 A1 | | 6/2009 | Basoor et al. | |
| 2010/0258712 A1 | * | 10/2010 | Wiese et al. | ............... 250/237 R |
| 2011/0056623 A1 | * | 3/2011 | Im et al. | ..................... 156/275.5 |

OTHER PUBLICATIONS

"Digital Proximity Sensor with Interrupt Function," Intersil Data Sheet for ISL29021, Mar. 3, 2009.
"APDS 9120, Integrated Digital Proximity Sensors, Data Sheet," Avago Technologies, 2009.
"APDS 9702, Signal Conditioning IC for Optical Proximity Sensors with Digital I2C Interface. Preliminary Datasheet (version 7)," Avago Technologies, 2009.
Technical Data Sheet, Nitto Denko, Corporation, NT-8506, 2001.
Technical Data Sheet, Nitto Denko Corporation, NT-MB-IRL3801, 2008.
Data sheet for "AIGaAs/GaAs infrared Chip—TK16IRA," Tyntek, Nov. 2006.

* cited by examiner

*Primary Examiner* — David Porta
*Assistant Examiner* — Kenneth J Malkowski

(57) ABSTRACT

Various embodiments of an optical proximity sensor having a lead frame and no overlying metal shield are disclosed. In one embodiment, a light emitter and a light detector are mounted on a lead frame comprising a plurality of discrete electrically conductive elements having upper and lower surfaces, at least some of the elements not being electrically connected to one another. An integrated circuit is die-attached to an underside of the lead frame. An optically-transmissive infrared pass compound is molded over the light detector and the light emitter and portions of the lead frame. Next, an optically non-transmissive infrared cut compound is molded over the optically-transmissive infrared pass compound to provide an optical proximity sensor having no metal shield but exhibiting very low crosstalk characteristics.

24 Claims, 9 Drawing Sheets

OPTICAL PROXIMITY SENSOR PACKAGE WITH LEAD FRAME

FIELD OF THE INVENTION

Various embodiments of the inventions described herein relate to the field of proximity sensors, and components, devices, systems and methods associated therewith.

BACKGROUND

Optical proximity sensors, such as the AVAGO TECHNOLOGIES™ HSDL-9100 surface-mount proximity sensor, the AVAGO TECHNOLOGIES™ APDS-9101 integrated reflective sensor, the AVAGO TECHNOLOGIES™ APDS-9120 integrated optical proximity sensor, and the AVAGO TECHNOLOGIES™ APDS-9800 integrated ambient light and proximity sensor, are known in the art. Such sensors typically comprise an integrated high efficiency infrared emitter or light source and a corresponding photodiode or light detector, and are employed in a large number of handheld electronic devices such as mobile phones, Personal Data Assistants ("PDAs"), laptop and portable computers, portable and handheld devices, amusement and vending machines, industrial automation machinery and equipment, contactless switches, sanitary automation machinery and equipment, and the like.

Referring to FIG. 1, there is shown a prior art optical proximity sensor 10 comprising infrared light emitter 16, light emitter driving circuit 51, light detector or photodiode 12, light detector sensing circuit 53, metal housing or shield 18 with apertures 52 and 54, and object to be sensed 60. Light rays 15 emitted by emitter 16 and reflected as light rays 19 from object 60 (which is in relatively close proximity to optical proximity sensor 10) are detected by photodiode 12 and thereby provide an indication that object 60 is close or near to sensor 10.

As further shown in FIG. 1, optical proximity sensor 10 further comprises metal housing or shield 18 formed of metal and comprising apertures 52 and 54 located over light emitter 16 and light detector 12, respectively, such that at least a first portion of light 15 emitted by light detector 12 passes through aperture 52, and at least a second portion of the first portion 19 of light reflected from object 60 in proximity to sensor 10 passes through aperture 54 for detection by light detector 12. As shown, metal housing or shield 18 may further comprise first and second modules 61 and 63 within which light emitter 16 and light detector 12 are disposed, respectively. The first and second modules 61 and 63 comprise adjoining optically opaque metal inner sidewalls 25 to provide optical isolation between first and second modules 61 and 63. Many optical proximity sensors generally include a metal shield, such as shield or housing 18 of the type shown in FIG. 1, to provide optical isolation between light emitter 16 and light detector or photodiode 12 so that undesired optical cross-talk between emitter 16 and detector 12 is minimized.

FIG. 2 shows a prior art optical proximity sensor 10 with a more complicated metal shield or housing 18 than that of FIG. 1. The optical proximity sensor shown in FIG. 2 is an AVAGO TECHNOLOGIES™ APDS-9800 Integrated Ambient Light and Proximity Sensor, which contains a printed circuit board ("PCB") substrate 11 upon which are mounted LED 16, light detector or photodiode 12, and ambient light sensor 14. The two-piece metal shield 18 covers LED 16, light detector or photodiode 12, and ambient light sensor 14 and contains a downwardly projecting light barrier 25 disposed therebetween. In the APDS-9800 optical proximity sensor, metal shield 18, being of a considerably more complicated shape and geometry than that of FIG. 2, is formed and thinned using progressive metal stamping techniques, and must be hand-fitted and attached to the underlying PCB by gluing to ensure proper alignment and fit.

As will now be seen, at least some optical proximity sensors of the prior art rely upon the use of an externally mounted metal shield 18, which is required to reduce the amount of crosstalk or interference that might otherwise occur between LED 16 and light detector 12, as well as to help increase the detection distance of the device. Metal shields 18 are quite small, however, making them difficult to manufacture in high volumes, and thus expensive to fabricate. Such metal shields 18 also generally require expensive automated equipment to attach same to sensors 10 in a mass production setting. Moreover, the quality of metal shields 18 often varies, and issues can arise with suppliers being unable to meet the tight dimensional tolerances required for such small devices. Metal shields 18 can also detach from sensor 10, thereby adding another failure point for sensor 10.

In addition, the commercial marketplace demands ever smaller portable electronic devices. This of course means there exists a strong motivation to make optical proximity sensors ever smaller. As optical proximity sensors become smaller, it becomes increasingly difficult to manufacture and attach the aforementioned metal shields to the sensors in a mass production setting. The metal shields themselves also add to the bulk and volume of the resulting sensor or package.

What is need is an optical proximity sensor design that eliminates the need to include a metal shield 18, but which retains high crosstalk and interference rejection characteristics so that an optical proximity sensor can be provided that features improved performance, lower cost, increased manufacturability and improved reliability. What is also needed is a smaller optical proximity sensor.

SUMMARY

In some embodiments, there is provided an optical proximity sensor package comprising a lead frame comprising a plurality of discrete electrically conductive elements having upper and lower surfaces, at least some of the elements not being electrically connected to one another, an infrared light emitter mounted atop an upper surface of at least a first of the plurality of discrete electrically conductive elements and electrically connected to at least a second of the plurality of discrete electrically conductive elements, a light detector mounted atop an upper surface of at least a third of the plurality of discrete electrically conductive elements and electrically connected to at least a fourth of the plurality of discrete electrically conductive elements, an integrated circuit mounted to a lower surface of one of the plurality of discrete electrically conductive elements, the integrated circuit comprising light emitter driving and light detecting circuits operably connected to the light emitter and the light detector, respectively, a first molded infrared light pass component disposed over and covering the light emitter, a second molded infrared light pass component disposed over and covering the light detector, and a molded infrared light cut component disposed over and between the first and second molded infrared light pass components and over portions of the plurality of discrete electrically conductive elements, the molded infrared light cut component having first and second apertures disposed therethrough above the light emitter and the light detector, respectively, wherein each of the plurality of discrete electrically conductive elements comprises an outer end extending outwardly from the molded infrared light cut component to form an electrical contact of the package.

In other embodiments, there is provided a method of making an optical proximity sensor comprising providing a lead frame comprising a plurality of discrete electrically conductive elements having upper and lower surfaces, at least some of the elements not being electrically connected to one another, mounting an infrared light emitter atop an upper surface of at least a first of the plurality of discrete electrically conductive elements and electrically connecting the infrared light emitter to at least a second of the plurality of discrete electrically conductive elements, mounting a light detector mounted atop an upper surface of at least a third of the plurality of discrete electrically conductive elements and electrically connecting the light detector to at least a fourth of the plurality of discrete electrically conductive elements, mounting an integrated circuit to a lower surface of one of the plurality of discrete electrically conductive elements, the integrated circuit comprising light emitter driving and light detecting circuits operably connected to the light emitter and the light detector, respectively, molding or casting a first infrared light pass component disposed over the light emitter, molding or casting a second infrared light pass component over the light detector, and molding or casting an infrared light cut component disposed over and between the first and second molded infrared light pass components and over portions of the plurality of discrete electrically conductive elements, the molded infrared light cut component having first and second apertures disposed therethrough above the light emitter and the light detector, respectively, wherein each of the plurality of discrete electrically conductive elements comprises an outer end extending outwardly from the molded infrared light cut component to form an electrical contact of the package.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

The drawings are not necessarily to scale. Like numbers refer to like parts or steps throughout the drawings, unless otherwise noted.

DETAILED DESCRIPTIONS OF SOME PREFERRED EMBODIMENTS

In the following Detailed Description, reference is made to the accompanying drawings, which form a part hereof, and in which are illustrated specific embodiments according to which the invention may be practiced. In this regard, directional terminology, such as "top," "bottom," "upper," "lower," "atop," "beneath," "forward," "backward," "side," "front," "back," etc., is used with reference to the orientation of the Figures being described. Because the components of various embodiments of the invention may be positioned in a number of different orientations, the directional terminology is used for purposes of illustration and is in no way limiting. It is to be understood that other embodiments may be utilized, and that structural or logical changes may be made without departing from the scope of the present invention. The following Detailed Description, therefore, is not to be taken in a limiting sense, and the scope of the present invention is defined by the appended claims.

Figure 10A:
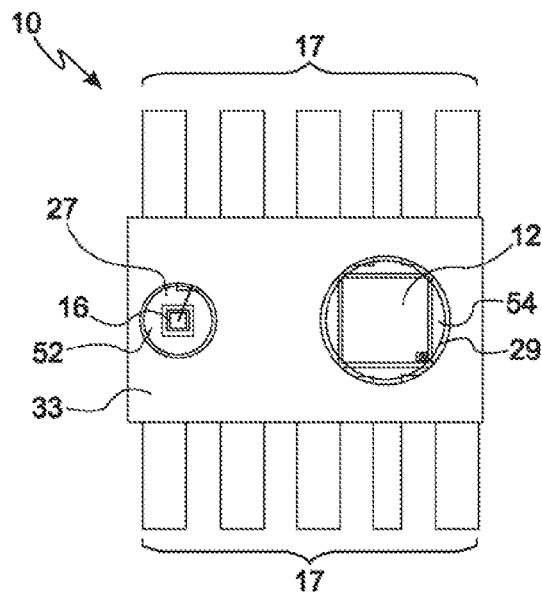
FIGS. 10(a) through 10(c) show top, top perspective and bottom views of ne embodiment of an optical sensor package prior to the external electrical contacts thereof being crimped or stamped into their final positions.
Figure 10B:
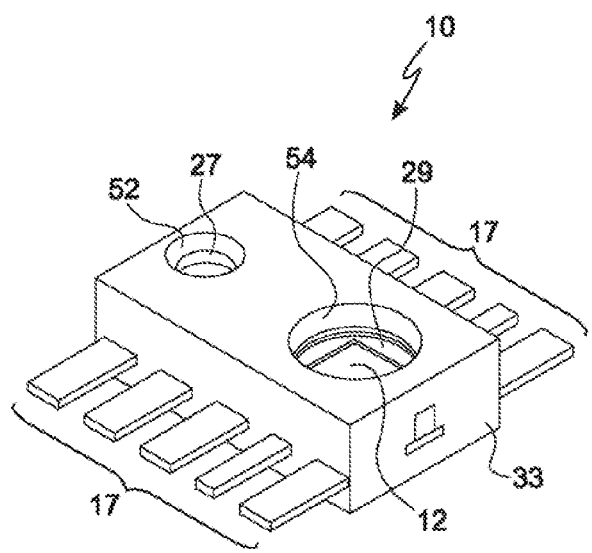
Figure 10C:
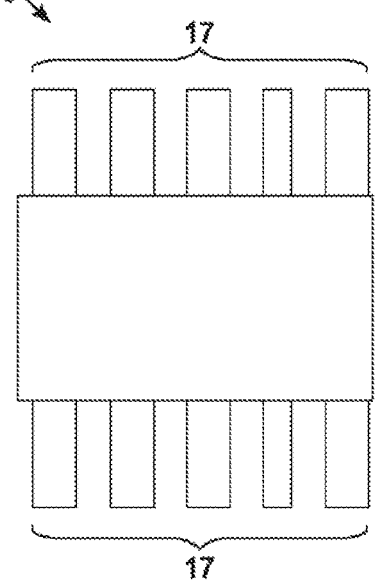
Figure 11A:
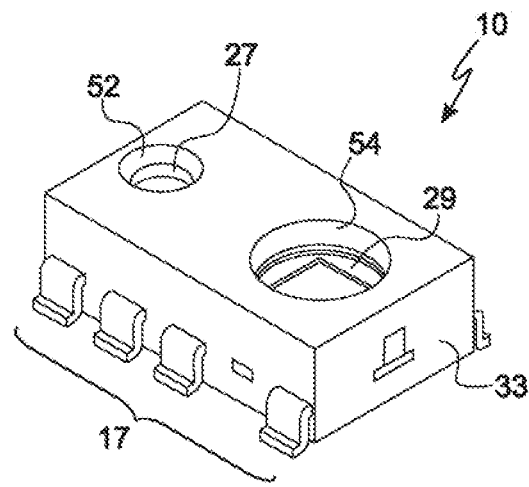
FIGS. 11(a) and 11(b) show top perspective and bottom perspective views of one embodiment of an optical sensor package in its final form, after the external contacts thereof have been crimped, stamped or otherwise formed into their final positions.
Figure 11B:
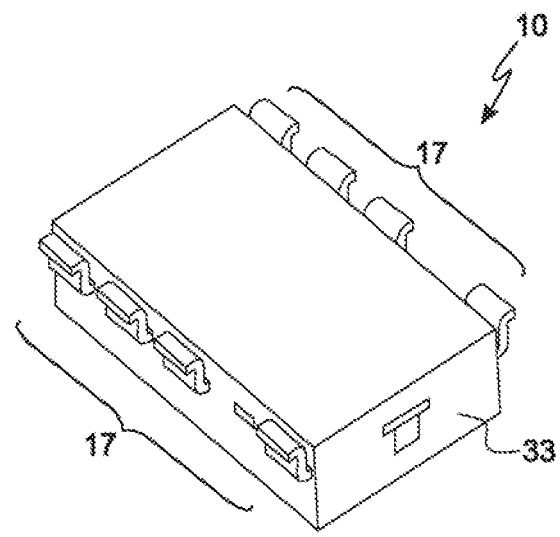

Referring now to FIGS. 3(a) through 11(b), there is shown one embodiment of optical proximity sensor 10 and its various components during various stages of assembly. The complete optical proximity sensor of such an embodiment is shown in FIGS. 11(a) and 11(b). As will become apparent, the embodiment of optical proximity sensor 10 shown in FIGS. 11(a) and 11(b) overcomes many of the problems associated with prior art optical proximity sensors by completely eliminating the need for a metal shield, reducing the overall size, volume and footprint of optical proximity sensor 10, reducing crosstalk between the light emitter and the light detector, and reducing manufacturing and material costs associated therewith. For example, in one embodiment optical sensor 10 shown in FIGS. 11(a) and 11(b) may be configured to have dimensions of about 4.0 mm×3.0 mm×1.3 mm. Many other advantages of the embodiment of the optical proximity sensor 10 illustrated in FIGS. 3(a) though 13 will become apparent to those skilled in the art upon having read, understood and considered the present specification and drawings.

Figure 1:
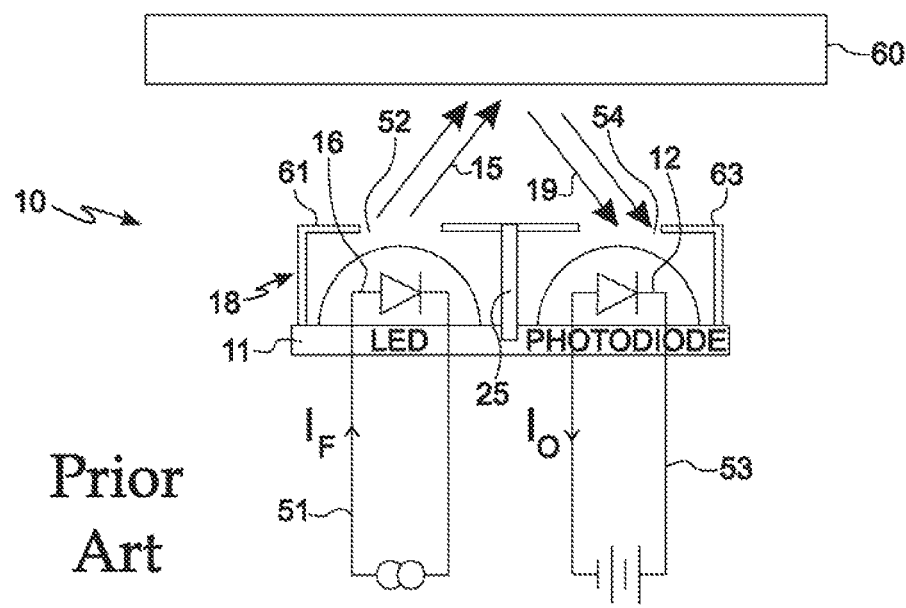
FIG. 1 shows a prior art optical proximity sensor and associated circuitry.
Figure 2:
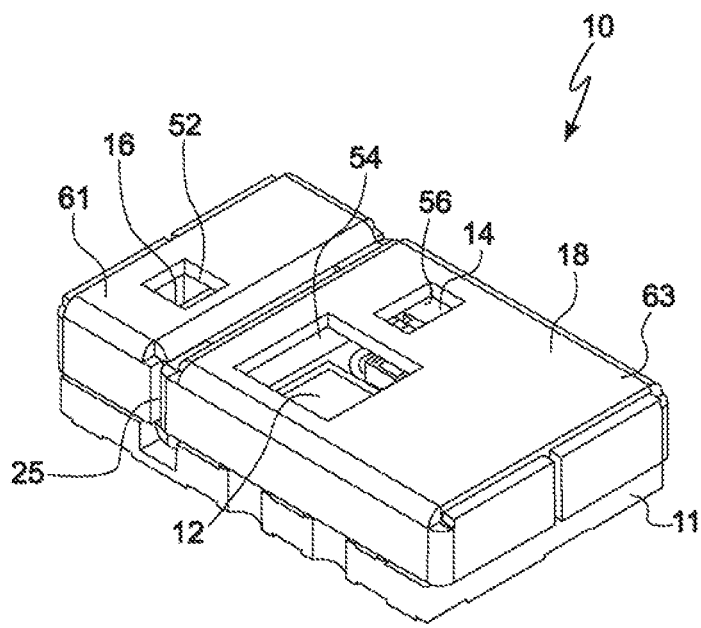
FIG. 2 shows a perspective view of an assembled prior art optical proximity sensor package.
Figure 3A:
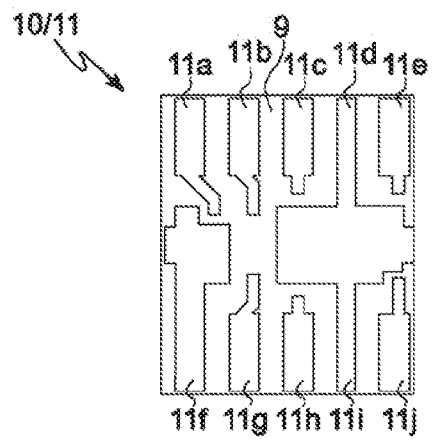
FIGS. 3(a) through 8(b) show top and top perspective views of one embodiment of an optical proximity sensor package during various stages of assembly.

Referring now to FIG. 3(a), there is shown a top view of bare lead frame 11 having a plurality of discrete electrically conductive elements 11a though 11j having upper and lower surfaces, where some of the elements are not electrically connected to one another, and where bare lead frame 11 is mounted on backing 9. The various discrete electrically conductive elements 11a though 11j of lead frame 11 are preferably formed of an electrically conductive metal or metal alloy comprising copper, gold, tin, or nickel, by way of example, but may also be formed of any other suitable electrically conductive metal, metal alloy, combination of metals, or a material such as a suitable electrically conductive polymer.

Figure 3B:
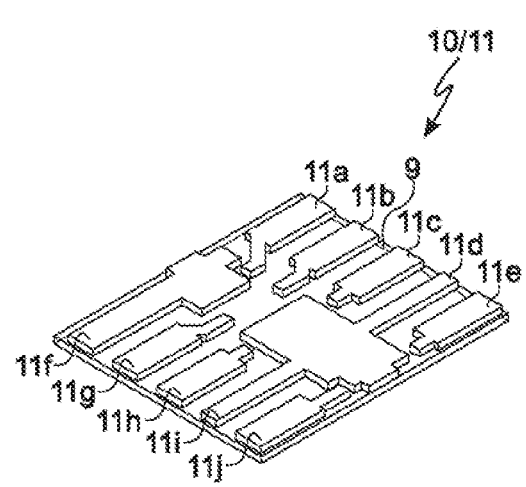

As further shown in FIG. 3(a), the plurality of discrete electrically conductive elements 11a though 11j are mounted on an adhesive (or at least tacky) backing 9 such as KAPTON™ tape, where backing 9 holds the various discrete electrically conductive elements 11a though 11j in place until backing 9 is removed in a subsequent step (see FIGS. 6(a) through 7(b)). Note that backing 9 is not limited to KAPTON™ tape, and may be any suitable backing material. In one embodiment, the various discrete electrically conductive elements 11a though 11j have a thickness of about 5 mils or about 0.127 mm. FIG. 3(b) shows a top perspective view of bare lead frame 11 mounted on backing 9 of FIG. 3(a).

Figure 4A:
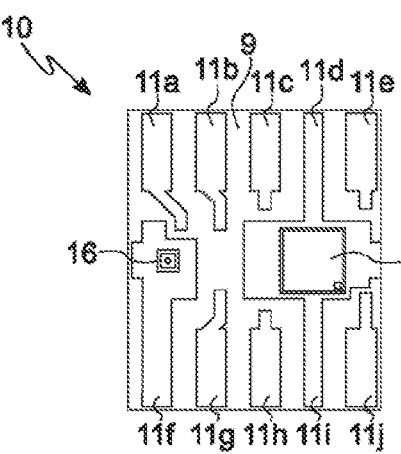
Figure 4B:
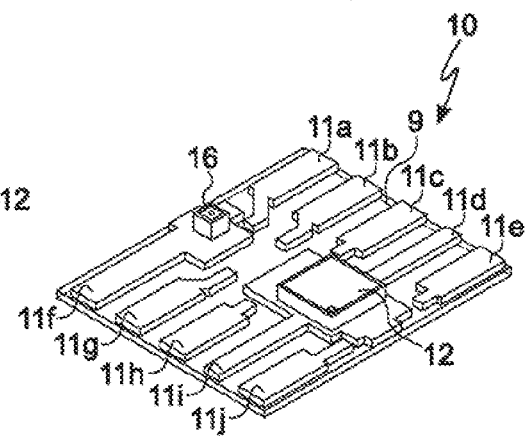

FIGS. 4(a) and 4(b) show top and top perspective views, respectively, of lead frame 11 having light emitter 16 and light detector 12 mounted or die attached to first and third discrete electrically conductive elements 11f and 11d/11i, respectively. According to one embodiment, light emitter 16 is a semiconductor infrared LED such as a Model No. TK116IRA TYNTEK™ AlGaAs/GaAs Infrared Chip, the data sheet for which is included in an Information Disclosure Statement filed on even date herewith and the entirety of which is hereby incorporated by reference herein. According to one embodiment, light detector 12 is an ASIC such as an AVAGO TECHNOLOGIES™ APDS-9120 integrated optical proximity sensor, the data sheet for which is included in an Information Disclosure Statement filed on even date herewith and the entirety of which is hereby incorporated by reference herein. (Note that an ambient light detector 14 such as an AVAGO TECHNOLOGIES™ APDS-9800 integrated ambient light and proximity sensor—not shown in the Figures—may also be included in package 10.) Light emitter 16 and light detector 12 may be attached to the top surfaces of first and third discrete electrically conductive elements 11f and 11d/11i using, by way of example, electrically non-conductive epoxy or electrically conductive epoxy, depending on the specific electrical configuration that is to be employed. Other means and materials for attaching or securing light emitter 16 and light detector 12 to first and third discrete electrically conductive elements 11f and 11d/11i are also contemplated.

Figure 5A:
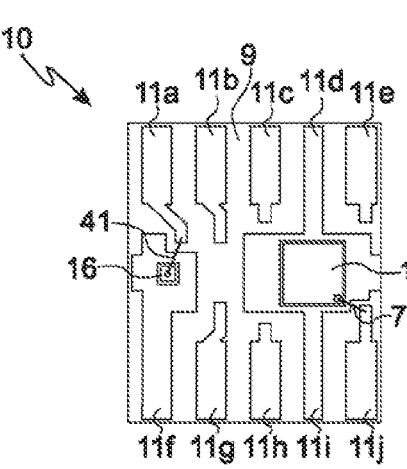
Figure 5B:
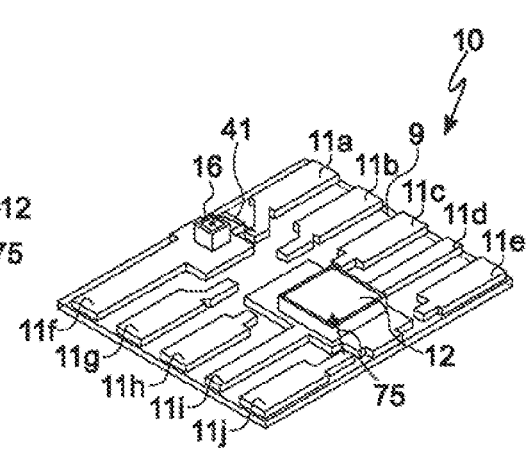

FIGS. 5(a) and 5(b) show top and top perspective views, respectively, of light emitter 16 and light detector 12 wire bonded to electrically conductive elements 11a and 11j, where wires 41 and 75 are employed to establish such electrical connections.

Figure 6A:
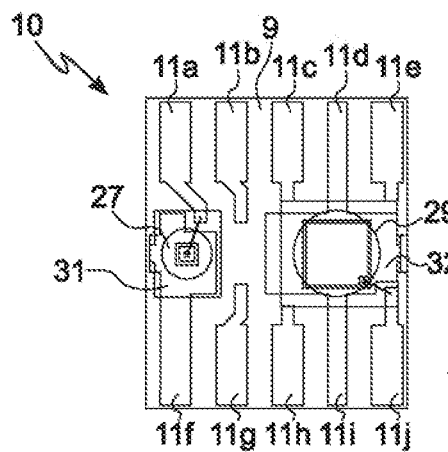
Figure 6B:
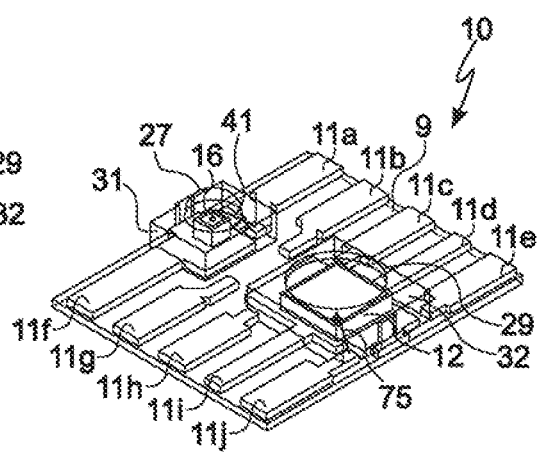

FIGS. 6(a) and 6(b) show top and top perspective views, respectively, of sensor 10 after a first molded optically transmissive infrared light pass component 31 has been disposed over and covers light emitter 16. Note that first molded optically transmissive infrared light pass component 31 may be shaped to include lens 27, as shown in FIGS. 6(a) and 6(b), lens 27 being configured to collimate and direct light emitted by light emitter 16 outwardly away from light emitter 16 towards object to be detected 60 (not shown in FIGS. 6(a) and 6(b)).

Continuing to refer to FIGS. 6(a) and 6(b), there is shown sensor 10 after second molded optically transmissive infrared light pass component 32 has been disposed over and covers light detector 12. Note that second molded optically transmissive infrared light pass component 32 may be shaped to include lens 29 as shown in FIGS. 6(a) and 6(b), where lens 29 is configured to collimate and direct light reflected from object to be detected 60 (not shown in FIGS. 6(a) and 6(b)) inwardly towards light detector 12. Optical lenses 27 and 29 of FIGS. 6(a) and 6(b) are preferably formed of the same material, and formed at the same time during the manufacturing process, as first and second molded optically transmissive infrared light pass components 31 and 32, and are operably disposed over light emitter 16 and light detector 12, respectively, as shown in FIGS. 6(a) and 6(b). A channel or space located between first and second molded optically transmissive infrared light pass components 31 and 32 may be formed by simply molding components 31 and 32 separately, or by cutting or sawing through the optically transmissive infrared light pass material located between components 31 and 32 after the molding or casting step associated with the optically transmissive infrared light pass material has been completed.

Figure 7A:
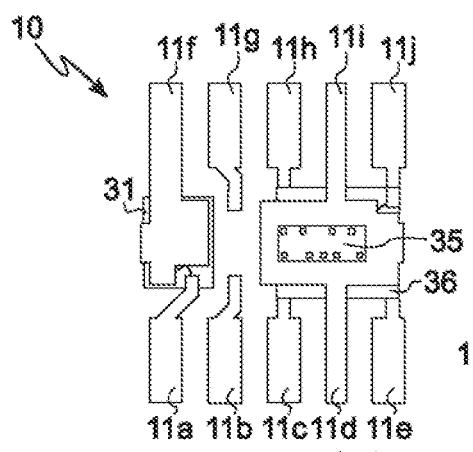
Figure 7B:
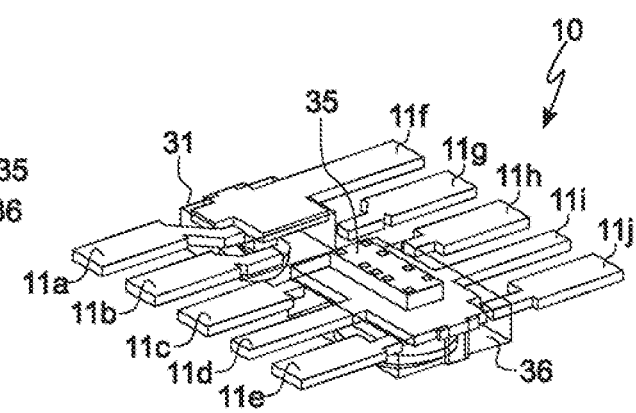

Between the step shown in FIGS. 6(a) and 6(b) on the one hand, and FIGS. 7(a) and 7(b) on the other hand, backing 9 is removed from lead frame 11 and application specific integrated circuit (ASIC) 35 is mounted to portions of the underside of lead frame 11. According to one embodiment, integrated circuit 35 is an AVAGO TECHNOLOGIES™ APDS-9702 signal conditioning IC for optical proximity sensors, the data sheet for which is hereby incorporated by reference herein in its entirety.

Figure 8A:
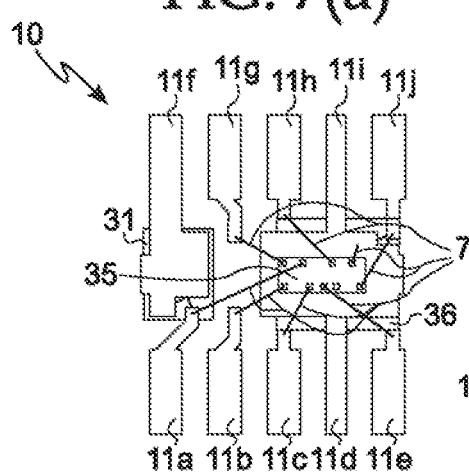
Figure 8B:
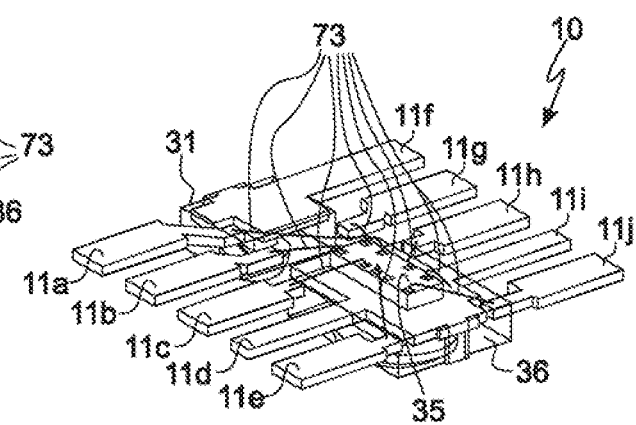

FIGS. 8(a) and 8(b) show top and top perspective views, respectively, of sensor 10 after ASIC 35 has been wire bonded to electrically conductive elements 11a, 11b, 11c, 11e, 11j, 11i, 11h and 11g, where wires 73 are employed to establish such electrical connections.

Figure 9A:
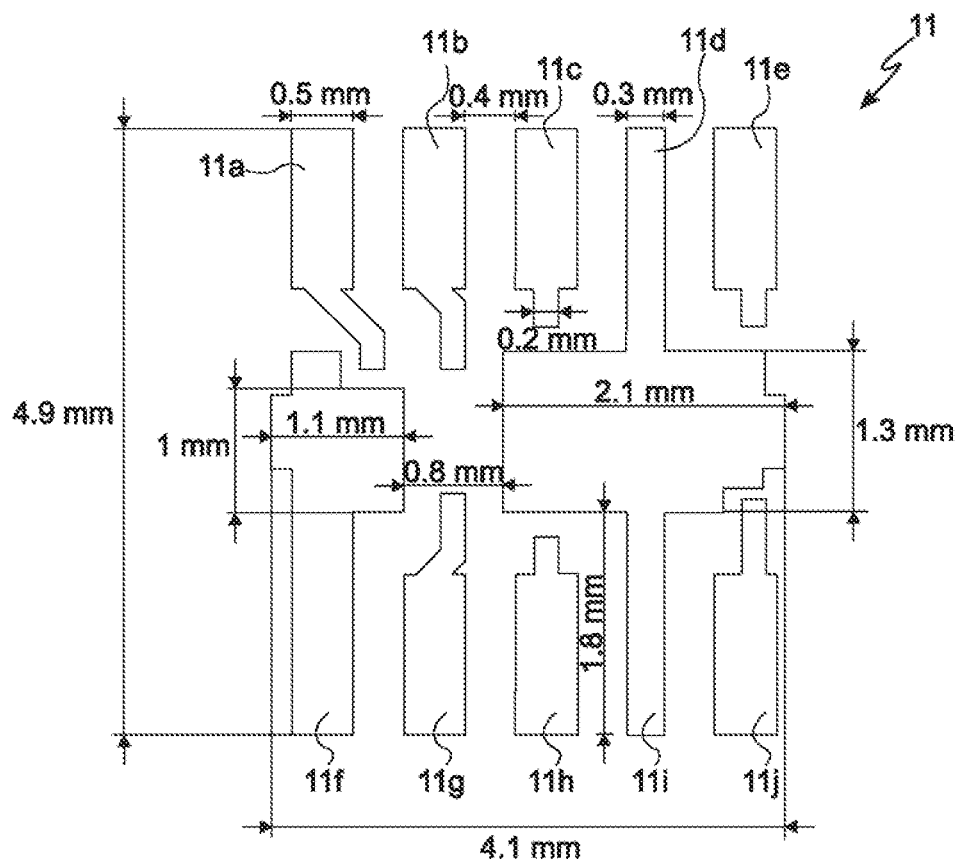
FIGS. 9(a) and 9(b) show top and top perspective views of one embodiment of a lead frame prior to other components being attached thereto or molded or casted thereover.
Figure 9B:
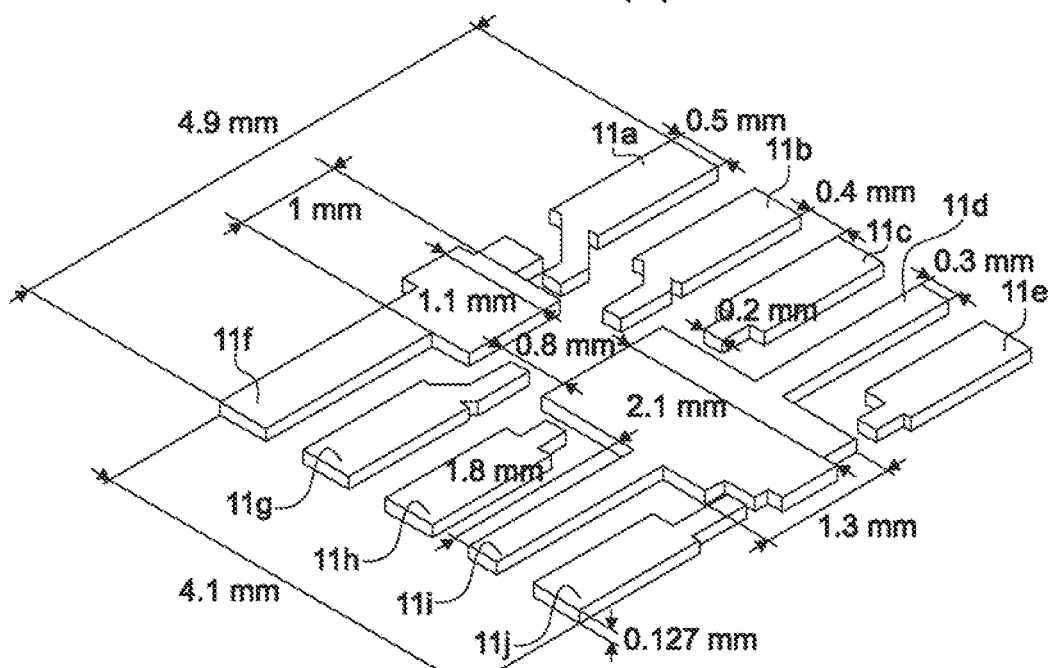

FIGS. 9(a) and 9(b) show top and top perspective views of lead frame 11 with nominal dimensions corresponding thereto according to one embodiment. It will be seen that the embodiment of lead frame 11 of FIGS. 9(a) and 9(b) has an overall length and an overall width of only 4.9 mm and 4.1 mm, respectively. Furthermore, the widths of the outer ends of the discrete electrically conductive elements, which are employed to provide electrical contacts for package 10 (more about which is said below), range between about 0.3 mm and about 0.5 mm.

Referring now to FIGS. 10(a) through 10(c), there are shown top, top perspective and bottom views, respectively, of package 10 after infrared light cut component 33 has been molded over first and second molded optically transmissive infrared light pass components 31 and 32, as well as over portions of lead frame 11. Note that apertures 52 and 54 are disposed through infrared light cut component 33 to permit light to be emitted through aperture 52 by light emitter 16, and light reflected from object to be detected 60 to pass through aperture 54 for incidence upon light detector 12. Infrared light cut component 33 extends and is molded between first and second molded optically transmissive infrared light pass components 31 and 32 so as to attenuate or absorb undesired scattered, reflected or direct light rays that might otherwise propagate between light emitter 16 and light detectors 12 and 14. That is, infrared light cut component 33 is configured and molded to substantially attenuate or block the transmission of undesired direct, scattered or reflected light between light emitter 16 and light detector 12, and thereby minimize optical crosstalk and interference between light emitter 16 and light detector 12.

FIGS. 11(a) and 11(b) show top perspective and bottom perspective views, respectively, of fully assembled sensor 10, where contacts 17 (or the outer ends of the discrete electrically conductive elements of lead frame 11 have been crimped, stamped or otherwise shaped to conform closely to the vertical sidewalls of package 10. Electrical contacts 17 permit the operable connection of sensor 10 to other devices, such as a portable electronic device into which sensor 10 is incorporated.

Infra-red rays emitted by light emitter or LED 16 exit sensor 10 and return to light detector 12 as rays, thereby permitting detection of object to be detected 60. Light rays internally reflected from the top or side surfaces of molded component 31 are blocked from reaching light detector 12 by molded substantially optically non-transmissive infrared light cut component 33. Light rays reflected from a window interposed between optical sensor 10 and object to be detected 60 are also blocked by molded substantially optically non-transmissive infrared light cut component 33. Total Internal Reflection (TIR) between components 31, 32 and 33 helps improve the performance of proximity sensor 10. As will now be seen, the embodiment of sensor 10 shown in FIGS. 3(a) through 11(b) eliminates the need to provide a metal shield, while improving the optical performance of sensor 10 by reducing crosstalk and interference, as undesired reflected, refracted or diffracted light rays cannot penetrate and travel through to light detectors 12 or 14. Moreover, sensor 10 has a very small footprint and device volume. Indeed, sensor 10 shown in FIGS. 11(a) and 11(b) yields a surprising footprint that is about 80% smaller than that of AVAGO TECHNOLGIES' first-generation APDS-9800 Integrated Proximity Sensor.

According to one embodiment, first and second molded optically transmissive infrared light pass components 31 and 32 are formed using an infrared-pass and optically transmissive transfer molding compound such as NITTO DENKO™ NT-8506 clear transfer molding compound 8506 or PENCHEM Technologies™ OP 579 infrared pass optoelectronic epoxy. Other suitable optically transmissive epoxies, plastics, polymers or other materials may also be employed. In some embodiments, and as discussed in further detail below, optically transmissive infrared light pass components 31 and 32 are molded during the same manufacturing step, or may be molded separately. See, for example, Technical Data Sheet NT-8506 entitled "Clear Transfer Molding Compound NT-8506" dated 2001 and PENCHEM OP 579 IR Pass Optoelectronic Epoxy Data Sheet, Revision 1, dated April, 2009.

In one embodiment, molded substantially optically non-transmissive infrared light cut component 33 is formed using an infrared-blocking, filtering or cutting transfer molding compound such as NITTO DENKO™ NT-MB-IRL3801 two-part epoxy resin material, NITTO DENKO™ NT8570 material, or PENCHEM Technologies™ OP 580 infrared filter optoelectronic epoxy, either of which preferably contains an amount of an infrared cutting material that has been selected by the user to achieve acceptable infrared light blocking performance while minimizing the amount of such infrared cutting material employed to keep costs to a minimum. Other suitable optically non-transmissive epoxies, plastics, polymers or other materials may also be employed. Se, for example, Technical Data Sheet NT-MB-IRL3801 published by DENKO™ dated 2008 and PENCHEM OP 580 IR Filter Optoelectronic Epoxy Data Sheet, Revision 1, dated April, 2009.

Figure 12:
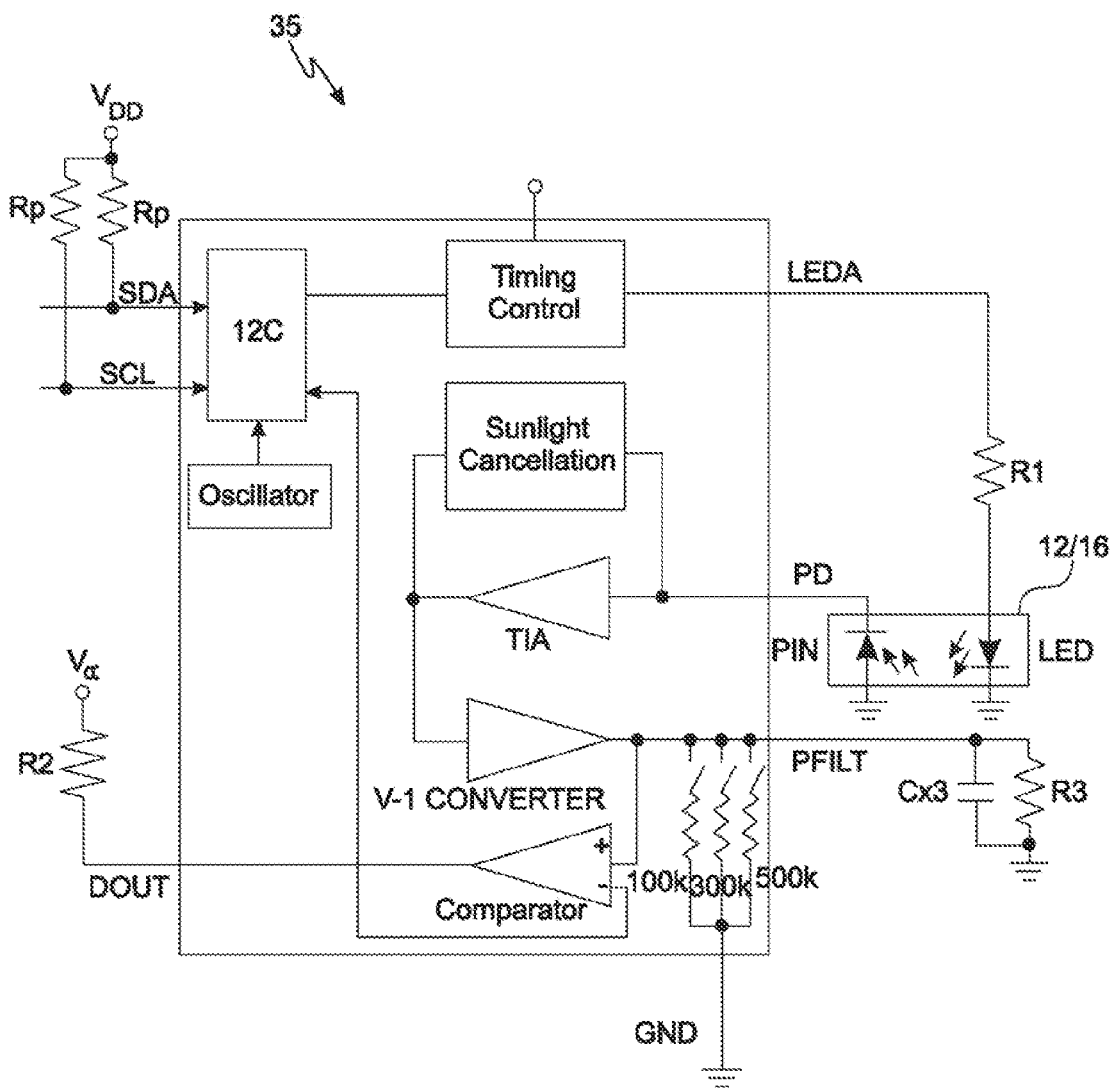
FIG. 12 shows one embodiment of circuitry for integrated circuit 35 and optical proximity sensor package 10.

FIG. 12 shows one embodiment of circuitry associated with integrated circuit 35 and proximity sensor 10, which in the illustrated embodiment is an Avago Technologies APDS 9702 signal conditioning integrated circuit. Other embodiments of such circuitry are contemplated.

Figure 13:
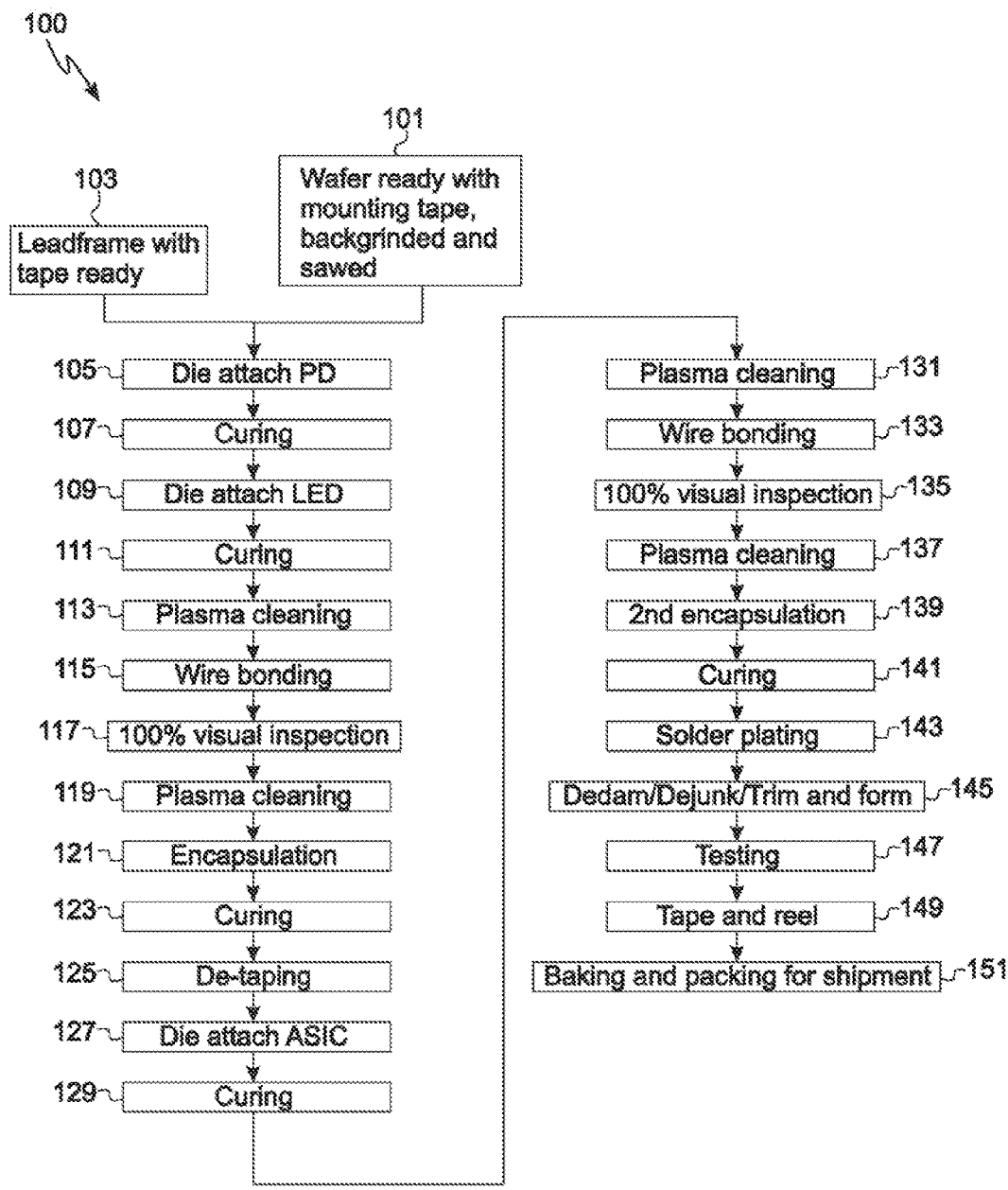
FIG. 13 shows one embodiment of a method for making an optical proximity sensor package.

FIG. 13 illustrates one embodiment of method 100 for making proximity sensor 10 of FIGS. 11(a) and 11(b). Method 100 begins by preparing and providing lead frame and backing 9 at step 103, and at step 101 preparing and providing semiconductor wafers containing integrated circuits 35 (Avago Technologies 9702 IC), LEDs 16 (LED TK114IR), light detector 12 (PD-TK043PD), and optionally ambient light sensor 14 (Avago Technologies 9005 IC), which are mounted on blue tape, backgrinded and diced. Individual dice 12 (PD-TK043PD) are attached to lead frames 11 in step 105 using an electrically conductive epoxy such as FDP5053 or FDP5100. The epoxy is cured in step 107. Next, individual dice 16 (LED TK114IR) are attached to lead frames 11 in step 109 using an electrically conductive epoxy such as FDP5053 or FDP5100. The epoxy is cured in step 111. After die attachment, plasma cleaning is conducted at step 113 to clean the surfaces of lead frames 11, and especially the wire bonding surfaces thereof, before wire bonding is conducted at step 115. After wire bonding, 100% visual inspection is conducted at step 117 to verify bond quality and integrity. Another plasma cleaning process is carried out at step 119. Next, a first transfer molding and encapsulation process is conducted at step 121 using NT8506 clear or infrared pass compound, followed at step 123 by post-mold curing. Backing 9 is then removed from lead frame 11 in a de-taping process at step 125. ASICs 35 are then die-attached to the undersides of lead frames 11 using an electrically non-conductive epoxy such ABLESTIK™ 2025. The epoxy is cured in step 129, followed by plasma cleaning at step 131, and wire bonding at step 133. After wire bonding, 100% visual inspection is conducted at step 133 to verify bond quality and integrity. Another plasma cleaning process is carried out at step 137. A second transfer molding process is conducted at step 145 using NT8570 infrared cut compound, followed at step 141 by post-mold curing. After curing, solder plating and dedamming, dejunking, trimming and forming are carried out at steps 143 and 145. During the trimming and forming steps, individual packages 10 are separated from the lead frame panel. Packages 10 are tested, taped and reeled, and baked and packed for shipment at steps 147, 149 and 151. Electrical testing is performed on individual sensors 10 at step 147. After testing, individual sensors 10 that have passed the electrical tests performed at step 147 are placed on tapes and reels at step 149, and then baked and packed for shipment at step 151.

Note that other many methods for making optical proximity sensor 10 are also contemplated, and that the order of the steps shown in FIG. 13 may be changed.

The transfer molding processes described above include methods where thermosetting materials are softened by heat and pressure in a transfer chamber, and then forced at high pressure through suitable sprues, runners, and gates into a closed mold for final curing. Casting, injection molding and other suitable methods and processes may also be employed to form components 31, 32 and 33.

Included within the scope of the present invention are methods of making and having made the various components, devices and systems described herein.

Those skilled in the art will understand that the various embodiments of the proximity sensor disclosed herein may be incorporated into portable electronic devices such as mobile telephones, smart phones, personal data assistants (PDAs), laptop computers, notebook computer, computers and other devices.

Various embodiments of the invention are contemplated in addition to those disclosed hereinabove. The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. An optical proximity sensor package, comprising:
 a lead frame comprising a plurality of discrete electrically conductive elements having upper and lower surfaces, at least some of the elements not being electrically connected to one another;
 an infrared light emitter mounted atop an upper surface of at least a first of the plurality of discrete electrically conductive elements and electrically connected to at least a second of the plurality of discrete electrically conductive elements;
 a light detector mounted atop an upper surface of at least a third of the plurality of discrete electrically conductive elements and electrically connected to at least a fourth of the plurality of discrete electrically conductive elements;

an integrated circuit chip mounted to a lower surface of one of the plurality of discrete electrically conductive elements and being mounted at least partially underneath at least one of the infrared light emitter and light detector, the integrated circuit chip comprising light emitter driving and light detecting circuits operably connected to the light emitter and the light detector, respectively;

a first molded infrared light pass component disposed over and covering the light emitter;

a second molded infrared light pass component disposed over and covering the light detector, and a molded infrared light cut component disposed over and between the first and second molded infrared light pass components and over portions of the plurality of discrete electrically conductive elements, the molded infrared light cut component having first and second apertures disposed therethrough above the light emitter and the light detector, respectively;

wherein each of the plurality of discrete electrically conductive elements comprises an outer end extending outwardly from the molded infrared light cut component to form an electrical contact of the package.

2. The optical proximity sensor of claim 1, wherein at least a first portion of light emitted by the light emitter passes through the first component and the first aperture, and at least a second portion of the first portion of light reflected from an object of interest in proximity to the sensor passes through the second aperture and the second component for detection by the light detector, and the infrared light cut component substantially attenuates or blocks the transmission of undesired direct, scattered or reflected light between the light emitter and the light detector and thereby minimizes optical crosstalk and interference between the light emitter and the light detector.

3. The optical proximity sensor of claim 1, wherein at least one of the first and second infrared light pass components comprises an optically transmissive epoxy, polymer or plastic.

4. The optical proximity sensor of claim 1, wherein the infrared light cut component comprises a substantially optically non-transmissive moldable material, epoxy, polymer or plastic.

5. The optical proximity sensor of claim 1, wherein the infrared light cut component further comprises an infrared cut or blocking additive.

6. The optical proximity sensor of claim 1, wherein the plurality of discrete electrically conductive elements of the lead frame comprise an electrically conductive metal or metal alloy.

7. The optical proximity sensor of claim 1, wherein at least one of the light emitter and the light detector is a semiconductor die.

8. The optical proximity sensor of claim 1, wherein the intergrated circuit chip comprises an application specific integrated circuit ("ASIC") and the intergrated circuit chip is mounted to the lower surface with an electrically non-conductive epoxy.

9. The optical proximity sensor of claim 1, wherein the optical proximity sensor is incorporated into a portable electronic device.

10. The optical proximity sensor of claim 9, wherein the portable electronic device is a smart phone, a mobile telephone, a personal data assistant (PDA), a laptop computer, a notebook computer, or a computer.

11. The optical proximity sensor of claim 1, wherein the light emitter is an LED.

12. The optical proximity sensor of claim 1, wherein the light detector is a positive-intrinsic-negative ("PIN") diode.

13. The optical proximity sensor of claim 1, wherein a molded optically transmissive lens is formed over at least one of the light emitter and the light detector.

14. A method of making an optical proximity sensor, comprising:

providing a lead frame comprising a plurality of discrete electrically conductive elements having upper and lower surfaces, at least some of the elements not being electrically connected to one another;

mounting an infrared light emitter atop an upper surface of at least a first of the plurality of discrete electrically conductive elements and electrically connecting the infrared light emitter to at least a second of the plurality of discrete electrically conductive elements;

mounting a light detector mounted atop an upper surface of at least a third of the plurality of discrete electrically conductive elements and electrically connecting the light detector to at least a fourth of the plurality of discrete electrically conductive elements;

mounting an integrated circuit chip to a lower surface of one of the plurality of discrete electrically conductive elements such that the intergrated circuit chip at least partially underlies at least one of the infrared light emitter and light detector, the integrated circuit chip comprising light emitter driving and light detecting circuits operably connected to the light emitter and the light detector, respectively;

molding or casting a first infrared light pass component disposed over the light emitter;

molding or casting a second infrared light pass component over the light detector, and molding or casting an infrared light cut component disposed over and between the first and second molded infrared light pass components and over portions of the plurality of discrete electrically conductive elements, the molded infrared light cut component having first and second apertures disposed therethrough above the light emitter and the light detector, respectively;

wherein each of the plurality of discrete electrically conductive elements comprises an outer end extending outwardly from the molded infrared light cut component to form an electrical contact of the package.

15. The method of claim 14, further comprising configuring the light detector and the light emitter with respect to one another such that at least a first portion of light emitted by the light emitter passes through the first component and the first aperture and at least a second portion of the first portion of light reflected from an object of interest in proximity to the sensor passes through the second aperture for detection by the light detector.

16. The method of claim 14, further comprising configuring the infrared light cut component to substantially attenuate or block the transmission of undesired direct, scattered or reflected light between the light emitter and the light detector thereby to minimize optical crosstalk and interference between the light emitter and the light detector.

17. The method of claim 14, further comprising forming optically transmissive lenses over the light emitter and the light detector when the first and second optically transmissive infrared light pass components are molded or casted.

18. The method of claim 14, wherein the light emitter or the light detector is die-attached to the substrate.

19. The method of claim 14, wherein the first and second optically transmissive infrared light pass components are casted or transfer-molded.

20. The method of claim 14, wherein the first and second optically transmissive infrared light pass components are casted or transfer-molded at the same time and later separated by a channel sawn or cut therebetween.

21. The method of claim 14, further comprising incorporating the optical proximity sensor into a portable electronic device.

22. The method of claim 21, wherein the portable electronic device is a smart phone, a mobile telephone, a personal data assistant (PDA), a laptop computer, a notebook computer, or a computer.

23. A method of making an optical proximity sensor, comprising:
providing a lead frame along with a backing for the lead frame, the lead frame comprising a plurality of discrete electrically conductive elements having upper and lower surfaces, at least some of the elements not being electrically connected to one another;
mounting an infrared light emitter atop an upper surface of at least a first of the plurality of discrete electrically conductive elements and electrically connecting the infrared light emitter to at least a second of the plurality of discrete electrically conductive elements;
mounting a light detector mounted atop an upper surface of at least a third of the plurality of discrete electrically conductive elements and electrically connecting the light detector to at least a fourth of the plurality of discrete electrically conductive elements;
removing the backing from the lead frame;
after the backing has been removed from the lead frame, adhering an intergrated circuit to a lower surface of one of the plurality of discrete electrically conductive elements such that the intergrated circuit at least partially underlies at least one of the infrared light emitter and light detector, the intergrated circuit comprising light emitter driving and light detecting circuits operably connected to the light emitter and the light detector, respectively;
molding or casting a first infrared light pass component disposed over the light emitter;
molding or casting a second infrared light pass component over the light detector, and molding or casting an infrared light cut component disposed over and between the first and second molded infrared light pass components and over portions of the plurality of discrete electrically conductive elements, the molded infrared light cut component having first and second apertures disposed threrethrough above the light emitter and the light detector, respectively;
wherein each of the plurality of discrete electrically conductive elements comprises an outer end extending outwardly from the molded infrared light cut component to form an electrical contact of the package.

24. The optical proximity sensor of claim 1, wherein the outer end of each of the plurality of discrete electrically conductive elements extend outwardly from a middle portion of the molded infrared light cut component and wherein the molded infrared light cut component substantially covers the integrated circuit chip that is mounted to the lower surface.

* * * * *